(12) United States Patent
Shang et al.

(10) Patent No.: US 12,093,110 B2
(45) Date of Patent: Sep. 17, 2024

(54) POWER CONTROL CIRCUIT AND CONTROL METHOD

(71) Applicant: Changxin Memory Technologies, Inc., Anhui (CN)

(72) Inventors: Weibing Shang, Hefei (CN); Enpeng Gao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/940,769

(22) Filed: Sep. 8, 2022

(65) Prior Publication Data
US 2023/0229224 A1 Jul. 20, 2023

(30) Foreign Application Priority Data
Jan. 14, 2022 (CN) .......................... 202210041557.4

(51) Int. Cl.
*G06F 1/324* (2019.01)
*G06F 1/3234* (2019.01)
(Continued)

(52) U.S. Cl.
CPC ............ *G06F 1/324* (2013.01); *G06F 1/3275* (2013.01); *G06F 1/3296* (2013.01); *G11C 5/148* (2013.01); *G11C 11/4074* (2013.01)

(58) Field of Classification Search
CPC ...... G06F 1/324; G06F 1/3275; G06F 1/3296; G11C 5/148; G11C 11/4074
See application file for complete search history.

(56) References Cited
U.S. PATENT DOCUMENTS 9,564,180 B1 * 2/2017 Pilo .................... G11C 5/148
9,754,655 B2 * 9/2017 Saifuddin ........... G11C 11/4087
(Continued)

FOREIGN PATENT DOCUMENTS

| CN | 107240413 A | 10/2017 |
|---|---|---|
| CN | 108417240 B | 10/2019 |

OTHER PUBLICATIONS

Non-Final Office Action dated Dec. 18, 2023, issued in related U.S. Appl. No. 17/940,723 (27 pages).
(Continued)

*Primary Examiner* — Aurel Prifti
(74) *Attorney, Agent, or Firm* — Sheppard Mullin Richter & Hampton LLP

(57) ABSTRACT

The present invention provides a power control circuit and control method. The power control circuit includes: a control module configured to control, according to an activation command, a memory bank of a plurality of memory banks to perform an operation; a power management module configured to wake up a local power supply for the memory bank according to a clock enable signal; and a power control module communicatively coupled with the power management module and configured to: send the clock enable signal to the power management module of the memory bank corresponding to the activation command in a power-saving mode; and send the clock enable signal to power management modules of the plurality of memory banks in a non-power-saving mode, where the power-saving mode indicates that a system clock is in a low-frequency state.

12 Claims, 9 Drawing Sheets

(51) Int. Cl.
*G06F 1/3296* (2019.01)
*G11C 5/14* (2006.01)
*G11C 11/4074* (2006.01)

(56) References Cited

U.S. PATENT DOCUMENTS

| | | | |
|---|---|---|---|
| 9,905,288 B2 * | 2/2018 | Ryu | G11C 11/4076 |
| 10,854,245 B1 * | 12/2020 | Shah | G06F 1/3275 |
| 11,061,619 B1 * | 7/2021 | Benisty | G06F 3/0625 |
| 11,164,618 B2 * | 11/2021 | Suh | G11C 11/40611 |
| 11,204,833 B1 * | 12/2021 | Rozen | G06F 11/076 |
| 11,347,297 B1 * | 5/2022 | Ko | G06F 1/3275 |
| 2011/0296098 A1 | 12/2011 | Sauber et al. | |
| 2013/0083611 A1 * | 4/2013 | Ware | G06F 3/0625 |
| | | | 365/191 |
| 2013/0191665 A1 * | 7/2013 | Mehta | G06F 1/324 |
| | | | 713/323 |
| 2013/0250664 A1 | 9/2013 | Takizawa | |
| 2013/0262792 A1 | 10/2013 | Barth, Jr. et al. | |
| 2014/0164810 A1 | 6/2014 | Isci et al. | |
| 2015/0048869 A1 * | 2/2015 | Huang | H03K 17/223 |
| | | | 327/143 |
| 2016/0141015 A1 * | 5/2016 | Lee | G11C 11/4087 |
| | | | 365/226 |
| 2016/0246531 A1 | 8/2016 | Takizawa | |
| 2017/0148504 A1 | 5/2017 | Saifuddin et al. | |
| 2017/0206031 A1 * | 7/2017 | Yin | G06F 1/3275 |
| 2017/0365305 A1 * | 12/2017 | Chang | G06F 1/32 |
| 2018/0088658 A1 * | 3/2018 | McFarlane | G06F 1/3296 |
| 2018/0253129 A1 * | 9/2018 | Singh | G11C 16/20 |
| 2020/0192455 A1 | 6/2020 | Kumar et al. | |
| 2021/0064119 A1 * | 3/2021 | Mirichigni | G11C 11/2275 |
| 2021/0065772 A1 | 3/2021 | Suh et al. | |
| 2021/0151085 A1 | 5/2021 | Kim et al. | |
| 2021/0239751 A1 * | 8/2021 | Lin | G01R 31/2882 |
| 2021/0271614 A1 * | 9/2021 | Roberts | G06F 1/324 |
| 2022/0043502 A1 * | 2/2022 | Kale | G06F 1/3225 |
| 2022/0121263 A1 * | 4/2022 | Mozak | G06F 1/324 |
| 2022/0179657 A1 * | 6/2022 | Barry | G06F 12/0284 |
| 2022/0254384 A1 * | 8/2022 | Wan | G11C 5/143 |
| 2022/0262427 A1 * | 8/2022 | Krishnakumar | |
| | | | G11C 11/40622 |
| 2022/0292025 A1 | 9/2022 | Shin et al. | |
| 2022/0334769 A1 | 10/2022 | Kim et al. | |
| 2023/0195316 A1 * | 6/2023 | Park | G11C 11/4074 |
| 2023/0335165 A1 * | 10/2023 | Giduturi | G11C 7/20 |
| 2024/0028099 A1 | 1/2024 | Laurent et al. | |

OTHER PUBLICATIONS

Final Office Action dated Aug. 8, 2024, issued in related U.S. Appl. No. 17/940,723 (23 pages).

* cited by examiner (a) Power-saving mode (b) Non-power-saving mode

POWER CONTROL CIRCUIT AND CONTROL METHOD

CROSS-REFERENCE TO RELATED APPLICATION

This application claims priority to Chinese Patent Application No. 202210041557.4, filed with the China National Intellectual Property Administration on Jan. 14, 2022 and entitled "POWER CONTROL CIRCUIT AND CONTROL METHOD." The above-referenced application is incorporated herein by reference in its entirety.

TECHNICAL FIELD

The present invention relates to memory technologies, and in particular, to a power control circuit and control method.

BACKGROUND

Memories, such as a dynamic random access memory (DRAM), are bedrocks of modern computing. Requirements for managing power consumption of memories are becoming increasingly important. There is a need to constantly improve memories to effectively reduce power consumption of memories.

SUMMARY

Embodiments of the present invention provide a power control circuit and control method, so as to reduce power consumption of a memory.

According to some embodiments, a first aspect of the present invention provides a power control circuit, including: a control module configured to control, according to an activation command, a memory bank of a plurality of memory banks to perform an operation; a power management module configured to wake up a local power supply for the memory bank according to a clock enable signal; and a power control module communicatively coupled with the power management module and configured to: send the clock enable signal to the power management module for the memory bank corresponding to the activation command in a power-saving mode; and send the clock enable signal to power management modules of the plurality of memory banks in a non-power-saving mode, where the power-saving mode indicates that a system clock is in a low-frequency state.

In some embodiments, in the low-frequency state, a clock cycle of the system clock is not shorter than a time length required for a power wakeup response corresponding to the activation command.

In some embodiments, the circuit further includes: a state determining module communicatively coupled with the power control module and configured to control the power control module to switch to the power-saving mode or the non-power-saving mode based on the system clock and a normalized signal, where the duration of the normalized signal is configured to indicate the time length required for the power wakeup response.

In some embodiments, the state determining module is configured to: send a first signal to the power control module to instruct the power control module to switch to the power-saving mode; and send a second signal to the power control module to instruct the power control module to switch to the non-power-saving mode.

In some embodiments, the state determining module includes: a signal generation unit, a comparison unit, and an output unit; the signal generation unit is configured to generate the normalized signal based on the system clock, where the normalized signal reflects the time length required for the power wakeup response; the comparison unit is communicatively coupled with the signal generation unit and is configured to compare the clock cycle of the system clock with the duration of the normalized signal; and the output unit is communicatively coupled with the comparison unit and the power control module and is configured to output the first signal or the second signal based on an output result of the comparison unit.

In some embodiments, the signal generation unit includes: a sampling circuit and a delay circuit; the sampling circuit is configured to generate a pulse signal based on a flipping edge of the system clock; and the delay circuit is communicatively coupled with the sampling circuit and is configured to delay the pulse signal and output the normalized signal.

In some embodiments, the delay circuit includes a plurality of stages of delay circuits, and the stages of delay circuits output a plurality of normalized signals including the normalized signal.

In some embodiments, the comparison unit includes a plurality of comparison subunits, respectively communicatively coupled with the stages of delay circuits and configured to compare the clock cycle of the system clock with the durations of the normalized signals output by the stages of delay circuits; and the output unit is configured to output the first signal or the second signal based on an output result of the comparison subunits.

In some embodiments, the activation command is output to a control module for a memory bank at a corresponding address by a command decoding control module after the address is decoded.

In some embodiments, in the power-saving mode, the power control module is configured to send the clock enable signal to the power management module of the memory bank corresponding to the activation command by controlling a port that outputs the clock enable signal.

In some embodiments, the power control circuit comprises a plurality of controllable switches, each of the plurality of controllable switches being between the power control module and each of the power management modules of the plurality of memory banks; and in the power-saving mode, the power control module is configured to send the clock enable signal to the power management module of the memory bank corresponding to the activation command by controlling at least some of the plurality of controllable switches be on or off.

According to some embodiments, a second aspect of the present invention provides a power control method, applicable to a power control circuit including a control module, a power management module, and a power control module, where the method includes: controlling, by the control module according to an activation command, a memory bank of the plurality of memory banks to perform an operation; waking up, by the power management module, a local power supply of the memory bank according to a clock enable signal; sending, by the power control module, the clock enable signal to the power management module of the memory bank corresponding to the activation command in response to a power-saving mode; and sending, by the power control module, the clock enable signal to power management modules of the plurality of memory banks in response to a non-power-saving mode, where the power-saving mode indicates that a system clock is in a low-frequency state.

In some embodiments, in the low-frequency state, a clock cycle of the system clock is not shorter than a time length required for a power wakeup response corresponding to the activation command.

In some embodiments, the power control circuit further includes a state determining module, and the method further includes: controlling, by the state determining module, the power control module to switch to the power-saving mode or the non-power-saving mode based on the system clock and a normalized signal, where the duration of the normalized signal is configured to indicate the time length required for the power wakeup response.

In some embodiments, the controlling, by the state determining module, the power control module to switch to the power-saving mode or the non-power-saving mode includes: sending, by the state determining module, a first signal to the power control module to instruct the power control module to switch to the power-saving mode; or sending a second signal to the power control module to instruct the power control module to switch to the non-power-saving mode.

In the power control circuit and control method provided in the embodiments of the present invention, the power control module switches to the power-saving mode or the non-power-saving mode based on a state of the system clock, and may select to send a clock enable signal to power management modules for some or all memory banks, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only a local power supply for a selected memory bank needs to be woken up; and in the non-power-saving mode, local power supplies for all memory banks are woken up, thereby improving flexibility of power wakeup management and reducing power consumption.

BRIEF DESCRIPTION OF DRAWINGS

The accompanying drawings, which are incorporated into and constitute a part of the description, illustrate the embodiments of the present invention and together with the description, serve to explain the principles of the embodiments of the present invention.

Figure 1:
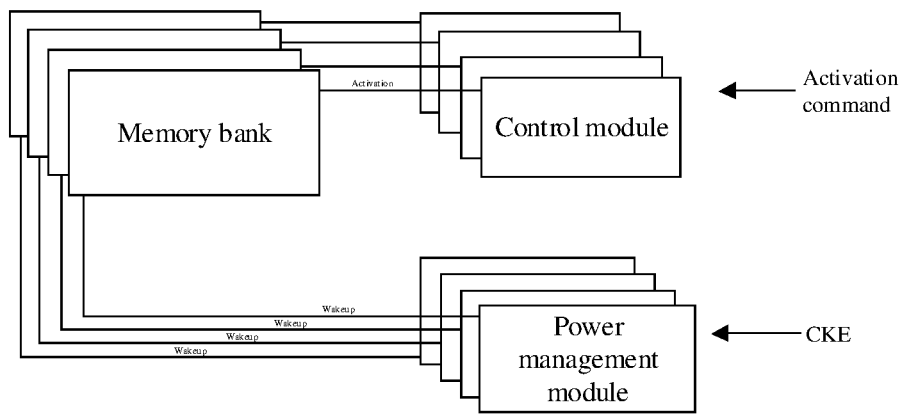
FIG. 1 is an exemplary diagram of a power management architecture of a memory.

Through the above accompanying drawings, specific embodiments of the present invention have been shown, and will be described in more detail below. These accompanying drawings and written descriptions are not intended to limit the scope of the concept of the present invention in any way, but to explain the concept of the present invention to persons skilled in the art by reference to specific embodiments.

DETAILED DESCRIPTION OF EMBODIMENTS

Herein, exemplary embodiments will be described in detail, and examples thereof are shown in the accompanying drawings. When the following description refers to the accompanying drawings, unless otherwise indicated, the same reference numerals in different drawings indicate the same or similar elements. Implementations described in the following exemplary embodiments do not represent all implementations consistent with the present invention. On the contrary, they are merely examples of an apparatus and a method consistent with some aspects of the present invention as described in detail in the appended claims.

The terms "include" and "have" in the present invention are used to indicate an open-ended inclusion, and that additional elements, components, or the like may be present in addition to the listed ones. The terms "first", "second", and the like are used merely for differentiation, rather than limiting the number of objects. In addition, different elements and regions in the accompanying drawings are merely schematic illustrations, and thus the present invention is not limited to the dimensions or distances shown in the accompanying drawings.

The technical solutions of the present invention are described in detail below by using specific embodiments. The following specific embodiments may be combined with each other, and the same or similar concepts or processes may not be repeated in some embodiments. The embodiments of the present invention are described below with reference to the accompanying drawings.

FIG. 1 is an exemplary diagram of a power management architecture of a memory. As shown in FIG. 1, the memory includes a plurality of memory banks, each of which includes a plurality of memory cells for storing data. Each memory bank includes a memory array, and a memory cell can be accurately found by first determining the memory bank and then specifying a row (Row) and a column (Column) of the memory bank.

The memory further includes a control module, also referred to as a local control unit. In practical application, the local control unit may correspond to each memory bank, and control the corresponding memory bank to perform a related operation according to a received activation command (for example, a common Act command) In addition, the memory further includes a power management module, also referred to as local power management. Similarly, in practical application, the power management module may correspond to each memory bank, and perform a management function, including but not limited to wakeup, on a local power supply for the corresponding memory bank.

Taking the above architecture as an example, in a power control manner, wakeup of power supplies for the memory banks is controlled based on a clock enable signal CKE. For example, when the memory enters a precharge power down (precharge power down) state, which is controlled by a clock enable signal, power management modules for all the memory banks control, in response to the current clock enable signal, local power supplies for the memory banks to enter a dormant mode. When the memory exits the precharge power down state and enters a precharge idle state (which is also controlled by a clock enable signal), the power management modules for all the memory banks control, in response to the current clock enable signal, the local power supplies for the memory banks to be woken up. The local power supplies for all the memory banks are woken up to enter an operating mode, and wait to receive an operation of an activation command (Active command).

It is found that based on the above power control manner, even if only one memory bank is selected, the local power supplies for all memory banks are woken up. Although an $I_{DD2P}$ current (Maximum Precharge Power-Down Standby Current) is reduced, an $I_{DD2N}/I_{DD3N}$ current (Maximum Precharge Standby Current/Maximum Active Standby Current) is not effectively reduced.

Figure 2A:
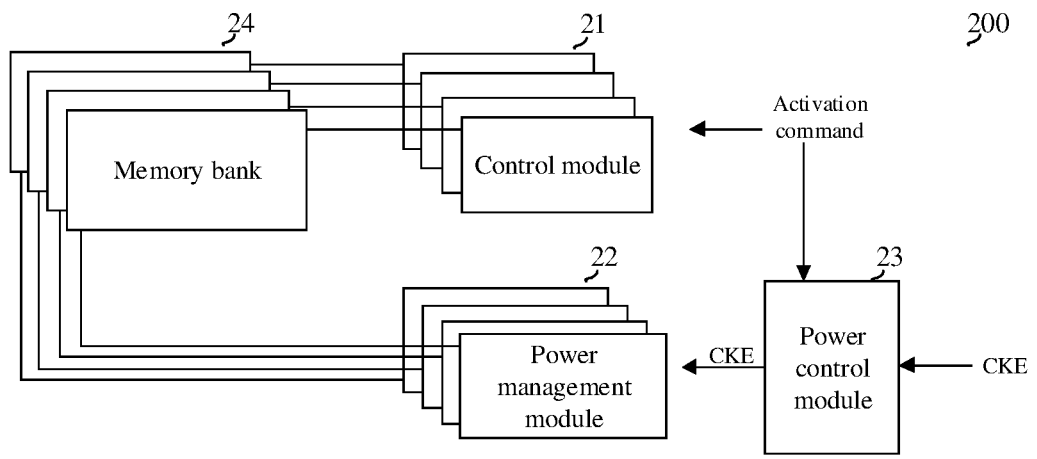
FIG. 2a is a schematic structural diagram of a power control circuit according to an embodiment of the present invention.

FIG. 2a is a schematic structural diagram of a power control circuit according to an embodiment of the present invention. The power control circuit provided in this embodiment is used to reduce power consumption of a memory. As shown in FIG. 2a, the power control circuit 200 includes: a control module 21 configured to control, according to an activation command, a memory bank 24 to perform an operation; a power management module 22 configured to wake up a local power supply for the memory bank 24 according to a clock enable signal; and a power control module 23 communicatively coupled with the power management module 22 and configured to: select to send the clock enable signal to the power management module for the memory bank corresponding to the activation command in a power-saving mode; and send the clock enable signal to power management modules for all memory banks in a non-power-saving mode, where the power-saving mode indicates that a system clock is in a low-frequency state.

In practical application, the power control circuit provided in this embodiment may be applied to various memories. As an example, the power control circuit may be applied to, but is not limited to, a double data rate synchronous dynamic random access memory (Double Data Rate Synchronous Dynamic Random Access Memory, DDR SDRAM for short), and the like.

Figure 2B:
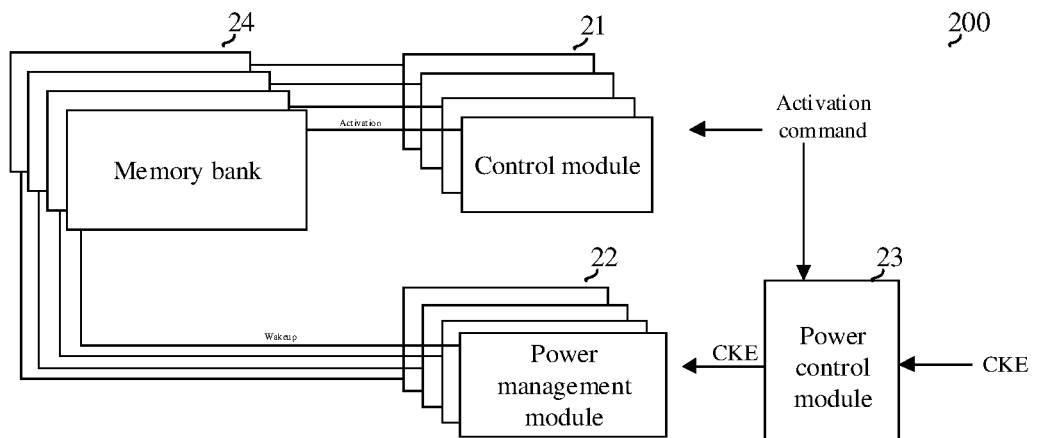
FIG. 2b shows an exemplary power control circuit operating in a power-saving mode and a non-power-saving mode.
Figure 2B:
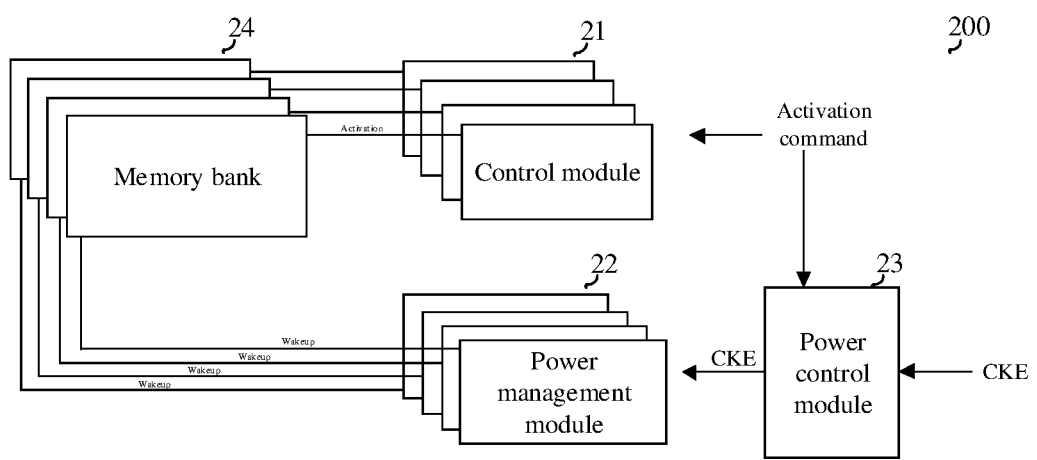

A frequency of the system clock represents a current operating frequency of an external system of the memory. In an example, in the low-frequency state, a clock cycle of the system clock is not shorter than a time length required for a power wakeup response. FIG. 2b shows an exemplary power control circuit operating in a power-saving mode and a non-power-saving mode. With reference to a scenario example, when the frequency of the system clock is relatively low, the clock cycle is relatively long and can cover the time length required for the power wakeup response. The time length required for the power wakeup response herein is a time length required for an entire process from reception of the activation command, after which the power control module determines, according to the activation command, a memory bank requiring wakeup, and controls the clock enable signal to reach the power management module for the memory bank, until the local power supply for the memory bank is woken up by the power management module. In this embodiment, when the frequency of the system clock supports a time length required for selecting a memory bank for wakeup, a selective-wakeup power control strategy is used, namely, the power-saving mode described in this embodiment. With the selective-wakeup power control strategy, the power control module selects only the memory bank corresponding to the activation command for power wakeup, and for other memory banks that are not selected by the activation command, their local power supplies do not need to be woken up, which effectively reduces power consumption of the memory while ensuring proper operation of the memory.

Similarly, with reference to the scenario example, when the frequency of the system clock is relatively high, the clock cycle is relatively short, and the foregoing solution of selecting the memory bank for power wakeup may not be supported. This is because, to ensure proper operation of the memory, it is usually desirable to complete the power wakeup for the memory before a next system clock arrives. Accordingly, in this case, an all-wakeup power control strategy is used, namely, the non-power-saving mode described in this embodiment. In other words, when the frequency of the system clock is relatively high, the proper operation of the memory needs to be ensured, and therefore, the all-wakeup power control strategy with the shortest time consumption is used. With the all-wakeup power control strategy, the power control module does not need to determine a selected memory bank, but directly transmits the clock enable signal to the power management modules for all the memory banks, which consumes a short time, and can adapt to a high-frequency system clock, thereby ensuring the proper operation of the memory.

In practical application, the activation command may be output to a control module for a memory bank at a corresponding address by a command decoding control module after an address signal is decoded, to instruct the selected memory bank to perform an operation, for example, including but not limited to read/write. In an example, a rising edge of a differential clock signal corresponding to the activation command represents information about the selected memory bank. This example is illustrated with reference to an activation command truth table shown in Table 1.

TABLE 1

| SDRAM COMMAND | BK ORG (BG, 16B, 8B) | SDR CMD PIN CS | DDR COMMAND PINS | | | | | | | Ck_t edge | Notes |
|---|---|---|---|---|---|---|---|---|---|---|---|
| | | | CA0 | CA1 | CA2 | CA3 | CA4 | CA5 | CA6 | | |
| DESELECT (DES) | Any | L | X | X | X | X | X | X | X |  R1 | 1, 2 |
| | | X | X | X | X | X | X | X | X |  F1 | |

TABLE 1-continued

| SDRAM COMMAND | BK ORG (BG, 16B, 8B) | SDR CMD PIN CS | CA0 | CA1 | CA2 | CA3 | CA4 | CA5 | CA6 | Ck_t edge | Notes |
|---|---|---|---|---|---|---|---|---|---|---|---|
| NO OPERATION (NOP) | Any | H | L | L | L | L | L | L | L | R1 | 1, 2 |
|  |  | X | X | X | X | X | X | X | X | F1 |  |
| POWER DOWN ENTRY (PDE) | Any | H | L | L | L | L | L | L | H | R1 | 1, 2, 12 |
|  |  | L | X | X | X | X | X | X | X | R2 |  |
| ACTIVATE-1 (ACT-1) | Any | H | H | H | H | R14 | R15 | R16 | R17 | R1 | 1, 2, 3, 4 |
|  | BG | X | BA0 | BA1 | BG0 | BG1 | R11 | R12 | R13 | F1 |  |
|  | 16B |  | BA0 | BA1 | BA2 | BA3 |  |  |  |  |  |
|  | 8B |  | BA0 | BA1 | BA2 | V |  |  |  |  |  |
| ACTIVATE-2 (ACT-2) | Any | H | H | H | L | R7 | R8 | R9 | R10 | R1 | 1, 2, 4 |
|  |  | X | R0 | R1 | R2 | R3 | R4 | R5 | R6 | F1 |  |

The first column represents command states of the memory. The second column represents an architecture of the memory bank. The third column and DDR COMMAND PINS represent chip select signals and various pin signals in different command states. For example, H represents a high level, and L represents a low level.

CK_t and CK_c are differential clock signals. In practical application, all address and control input signals are sampled at an intersection of a rising edge of CK_t and a falling edge of CK_c. It can be learned that, in the truth table, the memory bank corresponding to the activation command can be determined at a falling edge moment of a differential clock signal under an ACT-1 command BA0 represents an address of a memory bank 0, and this is true for BA1 to BA3. BG0 and BG1 each represent an address of a memory bank group (bank group). Therefore, in an example, the addresses of the memory banks in the truth table may be replaced with R14 to R17 corresponding to a rising edge of the differential clock signal under the ACT-1 command A specific replacement method is not limited. According to the truth table after the replacement, the memory bank corresponding to the activation command can be known earlier than that before the replacement, thereby advancing a power wakeup time. In this way, the power-saving mode can more reliably adapt to the system clock, so as to ensure reliable operation of the memory and expand the frequency of the system clock suitable for the power-saving mode.

In this embodiment, the power control module switches to the power-saving mode or the non-power-saving mode based on a state of the system clock, and may select to send a clock enable signal CKE to power management modules for some memory banks or all memory banks, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only a local power supply for a selected memory bank needs to be woken up; and in the non-power-saving mode, local power supplies for all memory banks are woken up, thereby improving flexibility of power wakeup management and reducing power consumption.

Figure 3:
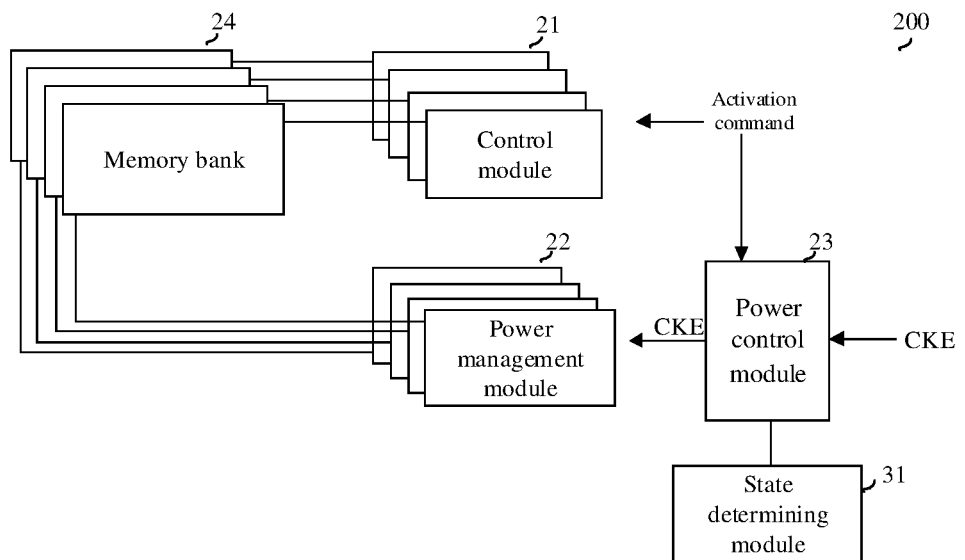
FIG. 3 is a schematic structural diagram of a power control circuit according to an embodiment of the present invention.

In some embodiments of the present invention, FIG. 3 is a schematic structural diagram of a power control circuit according to an embodiment of the present invention, which provides a related example of a mode switching strategy of the power control module. As shown in FIG. 3, the power control circuit 200 further includes a state determining module 31.

In some embodiments of the present invention, a state determining module 31 is communicatively coupled with the power control module 23 and is configured to control the power control module 23 to switch to the power-saving mode or the non-power-saving mode based on the system clock and a normalized signal (also called a standard clock), where the normalized signal reflects the time length required for the power wakeup response.

In practical application, the normalized signal may be generated in advance. In an example, a time length of the normalized signal may be set by testing an actual time length of the power wakeup response. Fault tolerance may also be considered when the normalized signal is set. For example, a fault tolerance time length is added to a response time length in an actual test, to further ensure reliability of power management control.

With reference to the scenario example, when the state determining module 31 determines, based on the system clock and the normalized signal, that the frequency of the system clock satisfies the normalized signal, the power control module 23 is controlled to switch to the power-saving mode. In the power-saving mode, the power control module 23 selects only the memory bank corresponding to the activation command for power wakeup, and for other memory banks that are not selected by the activation command, their local power supplies do not need to be woken up, which effectively reduces power consumption of the memory while ensuring proper operation of the memory. When the state determining module 31 determines, based on the system clock and the normalized signal, that the frequency of the system clock does not satisfy the normalized signal, the power control module 23 is controlled to switch to the non-power-saving mode. In the non-power-saving mode, the power control module directly transmits the clock enable signal to the power management modules for all the memory banks, which consumes a short time, and can adapt to a high-frequency system clock, thereby ensuring the proper operation of the memory.

In some embodiments, a manner in which the state determining module 31 controls the power control module 23 to switch to the power-saving mode or the non-power-saving mode is sending, by the state determining module 31, a first signal to the power control module 23 to instruct the power control module 23 to switch to the power-saving mode; or sending a second signal to the power control module 23 to enable the power control module 23 to switch to the non-power-saving mode. In other words, the first signal represents the power-saving mode, and the second signal represents the non-power-saving mode.

In some embodiments, the first signal and the second signal may be transmitted through different ports, and the power control module determines, based on a port through which the signal is currently received, a mode to which the power control module currently needs to switch. For example, it is assumed that the first signal and the second signal are both high-level signals, except that the first signal is received through a first port, and the second signal is received through a second port. For the power control module, when the first port receives the high-level signal, the power control module switches to the power-saving mode; when the second port receives the high-level signal, the power control module switches to the non-power-saving mode.

In some embodiments, the first signal and the second signal may be different signals transmitted through a port, and the power control module determines, based on a signal currently received through the port, a mode to which the power control module currently needs to switch. For example, it is assumed that the first signal and the second signal are received through the first port, the first signal is a high-level signal, and the second signal is a low-level signal. For the power control module, when the first port receives the high-level signal, the power control module switches to the power-saving mode; when the first port receives the low-level signal, the power control module switches to the non-power-saving mode.

Figure 4:
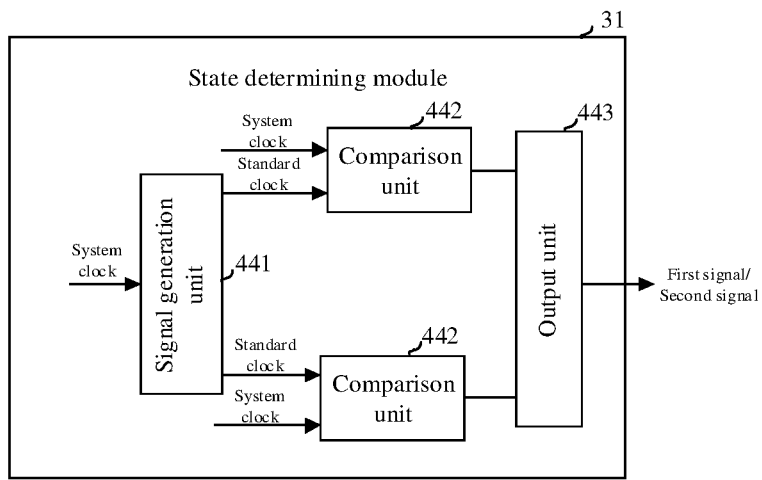
FIG. 4 is an exemplary structural diagram of a state determining module.

As an example, FIG. 4 is an exemplary structural diagram of the state determining module. As shown in FIG. 4, in some embodiments, the state determining module 31 includes: a signal generation unit 441, a comparison unit 442, and an output unit 443. The signal generation unit 441 is configured to generate the normalized signal based on the system clock. The comparison unit 442 is communicatively coupled with the signal generation unit 441 and is configured to compare the clock cycle of the system clock with the duration of the normalized signal. The output unit 443 is communicatively coupled with the comparison unit 442 and the power control module (not shown in FIG. 4) and is configured to output the first signal or the second signal based on an output result of the comparison unit 442.

The normalized signal reflects the time length required for the power wakeup response. In practical application, the normalized signal may be generated in advance. In an example, a time length of the normalized signal may be set based on an actual time length of the power wakeup response that is simulated and tested under actual conditions. Fault tolerance may also be considered when the normalized signal is set. For example, a fault tolerance time length is added to a response time length in an actual test, to further ensure reliability of power management control.

In some embodiments, the signal generation unit 441 includes: a sampling circuit and a delay circuit. The sampling circuit is configured to generate a pulse signal based on a flipping edge of the system clock; and the delay circuit is communicatively coupled with the sampling circuit and is configured to delay the pulse signal and output the normalized signal.

Figure 5A:
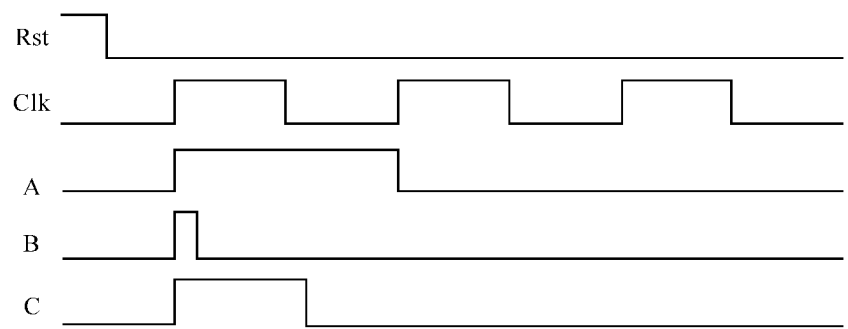
FIG. 5a and FIG. 5c are exemplary timing diagrams of various signals in a signal generation unit.

With reference to an example timing diagram of signals in the signal generation unit shown in FIG. 5a, an example is described. An Rst signal is used to reset an internal register and an RS flip-flop unit to a default state. Clk is the system clock. An A signal is a pulse signal having a system clock width that is generated by the system clock after Rst is canceled. A B signal is a narrow pulse signal generated by the sampling circuit in response to a rising edge of the A signal, to achieve synchronization with the start of the first system clock cycle. Further, the delay circuit delays outputting a normalized signal C signal based on the B signal. In an example, a delay time for the B signal may be slightly longer than the time length of the power wakeup response that is obtained through the simulation, to consider a possible error in the simulation.

Figure 5B:
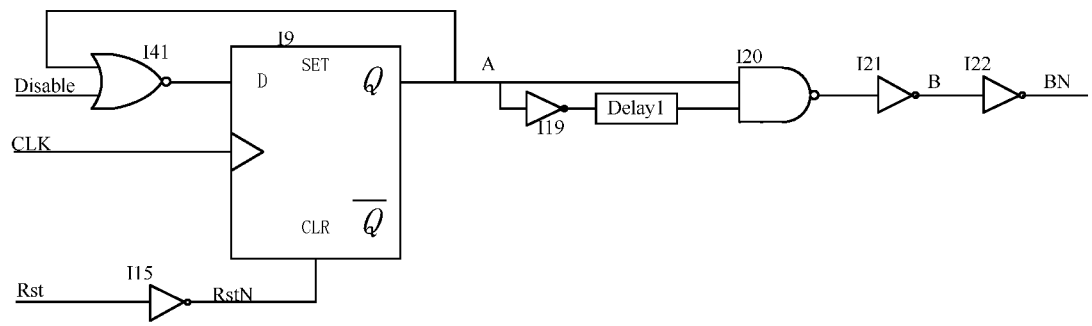
FIG. 5b shows an exemplary circuit structure of a sampling circuit.

As an example, FIG. 5b shows an exemplary circuit structure of the sampling circuit. CLK is a system clock signal, and Disable is a preset signal, which keeps the low-level state. Rst is a reset signal, which is used to initially reset each circuit structure to a default state. With reference to the circuit structure shown in FIG. 5b, an example description of the working principle of the sampling circuit is provided.

First phase: Initially, the sampling circuit is in a reset state, and Rst is at a high level (for example, 1). Correspondingly, an inverted signal RstN of Rst is at a low level, such that a D flip-flop outputs a low level by default, that is, the A signal is at the low level (for example, 0). Correspondingly, an input end of the D flip-flop receives a high level output by a NOR gate I41, but since the D flip-flop is not activated at this time, the D flip-flop still outputs 0 by default. A first input end of a NAND gate I20 is 0, and a signal to a second input end is a signal obtained by delaying the A signal, which is also 0. Therefore, in this case, the NAND gate I20 outputs 1; correspondingly, the B signal is 0, and an inverted signal BN of the B signal is 1.

Second phase: The sampling circuit starts to operate, Rst is set to the low level, RstN is at the high level, and the D flip-flop is in an active state. In the active state, if the system clock does not flip, for example, the system clock keeps the low level, the output of the D flip-flop does not change, and still keeps the output at the low level even if the input end receives the high level. Only when the system clock flips (for example, when the rising edge arrives), in response to the rising edge of the system clock, the D flip-flop outputs a signal consistent with the input end, that is, the output flips to the high level until a next rising edge of the system clock arrives. At the same time, as the A signal flips to 1, the input signal of the D flip-flop flips to 0. When the next rising edge of the system clock arrives, the A signal output by the D flip-flop flips to 0. Therefore, the A signal has one cycle width of the system clock, that is, acquisition of a pulse signal having one system clock width is completed. The A signal is subsequently used for comparison with the normalized signal, to determine which mode (the power-saving mode or the non-power-saving mode) the power control module operates in.

Still in the above second phase, the A signal flips to 1, and therefore the first input of the NAND gate I20 is 1. The second input of the NAND gate I20 does not flip initially due to the delay of the inverter I19 and Delay1, and still remains 1, such that the output of the NAND gate I20 flips to 0, the B signal flips to 1, and the BN signal flips to 0. Then, when the inverted signal of the A signal reaches the second input of the NAND gate I20 after the delay, the first input of the NAND gate I20 is 1, the second input is 0, the output flips to 1, the B signal flips to 0, and the BN signal flips to 1, to complete the output of the pulse signal. After the above two phases, the sampling circuit generates a pulse signal, namely the B signal, based on the flipping edge of the system clock. The inverted signal of the B signal, namely the BN signal, is used for the generation of the normalized signal.

In some embodiments, there may be a plurality of normalized signals, to improve the accuracy of mode determining. For example, the delay circuit may include a plurality of stages of delay circuits, and the plurality of normalized signals may be respectively output by the stages of delay circuits. Delays of different stages of delay circuits are different.

Figure 5C:
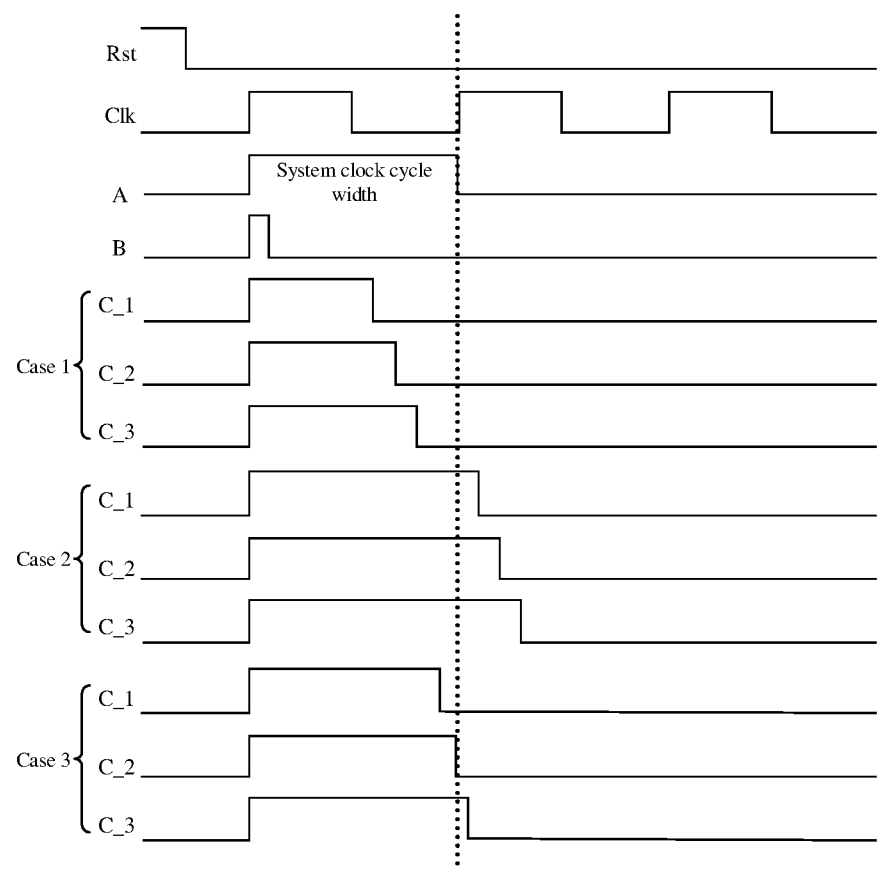

With reference to an exemplary timing diagram of signals in the signal generation unit shown in FIG. 5c, an example is described. An Rst signal, a Clk signal, an A signal, and a B signal are similar to those in the foregoing example. Further, the stages of delay circuits of the delay circuit output a plurality of normalized signals, for example, a C_1 signal, a C_2 signal, and a C_3 signal in the figure, based on the B signal after different delays. In some embodiments, the pulse of the C_2 signal is 50 ps to 100 ps wider than that of the C_1 signal, and the pulse of the C_3 signal is 50 ps to 100 ps wider than that of the C_2 signal, to consider different fault tolerance cases. Optionally, based on the plurality of normalized signals, the following strategies can be implemented to determine whether the frequency of the current system clock satisfies the normalized signal. In a first case, when pulse widths of the C_1 signal, the C_2 signal, and the C_3 signal are all narrower than a pulse width of A (indicating a width of the system clock cycle), it indicates that the frequency of the current system clock is relatively low and can support the time length required for the power wakeup response. In a second case, when the pulse widths of the C_1 signal, the C_2 signal, and the C_3 signal are all wider than the pulse width of A, it indicates that the frequency of the current system clock is relatively high and may fail to support the time length required for the power wakeup response. In a third case, when the pulse widths of the C_1 signal, the C_2 signal, and the C_3 signal are close to the pulse width of A, for example, a difference therebetween falls within a predetermined range, a majority vote can be used to determine whether the requirements for the power-saving mode are satisfied. For example, the C_1 signal, the C_2 signal, and the C_3 signal each may be compared with A, and results obtained from the comparison can be voted by majority to determine whether to enable the power-saving mode.

Figure 5D:
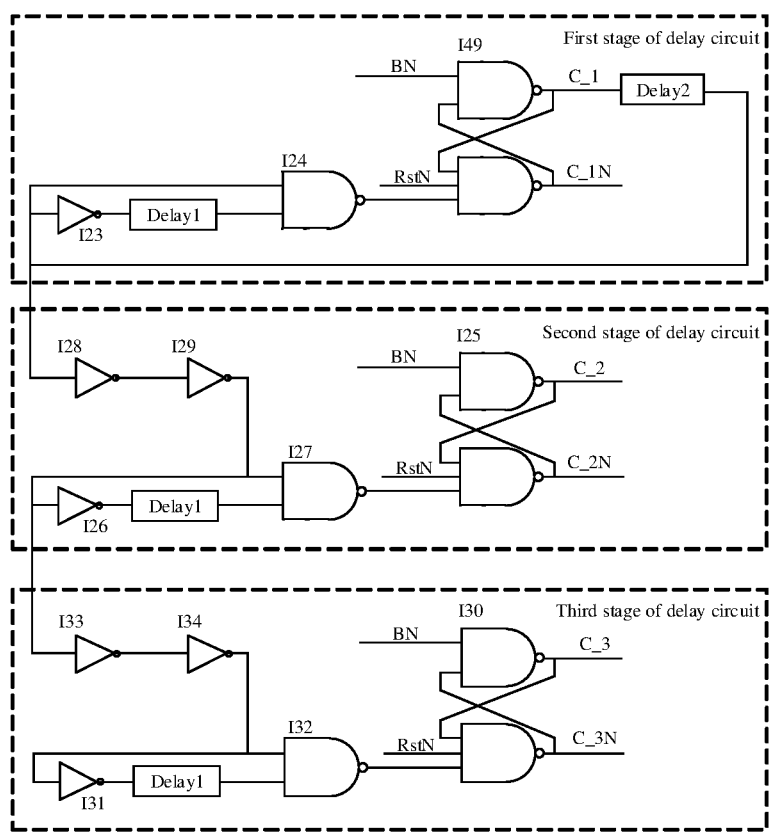
FIG. 5d shows an exemplary circuit structure of a delay circuit.

As an example, FIG. 5d shows an exemplary circuit structure of the delay circuit. Signals are consistent with the signals described above. With reference to the circuit structure shown in FIG. 5d, an exemplary description of the working principle of the delay circuit is provided.

First phase: Initially, the sampling circuit is in a reset state, the BN signal is at a high level (for example, 1), and RstN is at a low level (for example, 0). Therefore, the first stage of delay circuit is composed of two NAND gates, a flip-flop I49 equivalent to an RS flip-flop outputs the C_1 signal, and the C_1 signal is 0 at this time. The C_1 signal reaches a first input end of a NAND gate I24 after the delay of a delay structure Delay2, where a first input to the NAND gate I24 is 0; and reaches a second input end of the NAND gate I24 after the delay of an inverter I23 and a delay structure Delay1, where a second input to the NAND gate I24 is 1, and the NAND gate I24 outputs 1 as a third input to the flip-flop I49.

For the second stage of delay circuit, the C_1 signal (0 at this time) reaches a first input end of a NAND gate I27 after the delay of the delay structure Delay2, and the delay of inverters I28 and I29. Specifically, the first input is 0. In addition, a signal output by the inverter I29 reaches a second input end of a NAND gate I27 after the delay of an inverter I26 and Delay1. Specifically, the second input is 1. Therefore, the NAND gate I27 also outputs 1 as a third input to a flip-flop I25. In this phase, BN is 1, and RstN is 0. Therefore, the flip-flop I25 outputs the C_2 signal, and the C_2 signal is 0 at this time.

Similarly, for the third stage of delay circuit, the C_1 signal (0 at this time) reaches a first input end of a NAND gate I32 after the delay of the delay structure Delay2, the delay of the inverters I28 and I29, and the delay of inverters I33 and I34. Specifically, the first input is 0. In addition, the signal output by the inverter I34 reaches a second input end of the NAND gate I32 through an inverter I31 and Delay1. Specifically, the second input is 1. Therefore, the NAND gate I32 also outputs 1 as a third input to a flip-flop I30. In this phase, BN is 1, and RstN is 0. Therefore, the flip-flop I30 outputs the C_3 signal, and the C_3 signal is 0 at this time.

Second phase: RstN is 1, and the sampling circuit starts to operate, and in response to the flipping of the system clock, generates a pulse signal B having one system clock width. In other words, when the system clock flips (for example, the rising edge arrives), the inverted signal BN of the B signal first flips to 0, and then flips back to 1 after a short period of time.

For the first stage of delay circuit, when BN flips to 0, RstN is 1, and the third input to the flip-flop I49 is 1. Therefore, the flip-flop I49 outputs the C_1 signal, and the C_1 signal flips to 1 at this time. Until the C_1 signal reaches the first input end of the NAND gate I24 after the delay of the delay structure Delay2, in addition, the low-level signal of the C_1 signal passing through the inverter I23 has not yet reached the NAND gate I24 due to the delay of the delay structure Delay1. Therefore, for the NAND gate I24, the two inputs at this time are both 1. Correspondingly, the output signal of the NAND gate I24 flips to 0, such that the third input of the flip-flop I49 is 0. At this time, RstN is 1, BN has flipped back to 1, and therefore the C_1 signal output by the flip-flop I49 flips to 0 again. In other words, the width of the C_1 signal in this example mainly depends on duration of the delay of the delay structure Delay2. In practical application, the duration of the delay of the delay structure Delay2 may be set based on needs. It should be noted that when the low-level signal output by the inverter I23 subsequently reaches the NAND gate I24 after the delay of Delay1, the NAND gate I24 outputs 1 again, so as to prepare for the next operation.

For the second stage of delay circuit, similarly, when BN flips to 0, RstN is 1, and the third input to the flip-flop I25 is 1. Therefore, the flip-flop I25 outputs the C_2 signal, and the C_2 signal flips to 1 at this time. Until the C_1 signal reaches the first input end of the NAND gate I27 after the delay of the delay structure Delay2, and the delay of the inverters I28 and I29, the two inputs to the NAND gate I27 are both 1. Correspondingly, the third input to the flip-flop I25 is 0. At this time, RstN is 1, BN has flipped back to 1, and therefore the C_2 signal output by the flip-flop I25 flips to 0 again. In other words, the width of the C_2 signal in this example mainly depends on duration of the delay of the delay structure Delay2 and the delay of the inverters I28 and I29. Therefore, in practical application, the duration of the delay may be set based on needs. It should be noted that, although the inverters I28 and I29 are used to implement the delay as an example in the figure, other delay structures may also be used in practical application, which is not limited in this example.

Similarly, for the third stage of delay circuit, the width of the C_3 signal mainly depends on duration of the delay of the delay structure Delay2, the inverters I28 and I29, and the inverters I33 and I34. Therefore, in practical application, the duration of the delay may be set based on needs. It should also be noted that, although the inverters I33 and I34 are used to implement the delay as an example in the figure, other delay structures may also be used in practical application, which is not limited in this example.

The circuit in the above example uses the plurality of stages of delay to generate the plurality of normalized signals, so as to more reliably determine the operating mode of the power control module.

For the scenario of the plurality of normalized signals, in some embodiments, the comparison unit 442 includes a plurality of comparison subunits, respectively communicatively coupled with the stages of delay circuits and configured to compare the clock cycle of the system clock with the durations of the normalized signals output by the stages of delay circuits; and the output unit 443 is configured to output the first signal or the second signal based on an output result of the comparison subunits.

Figure 5E:
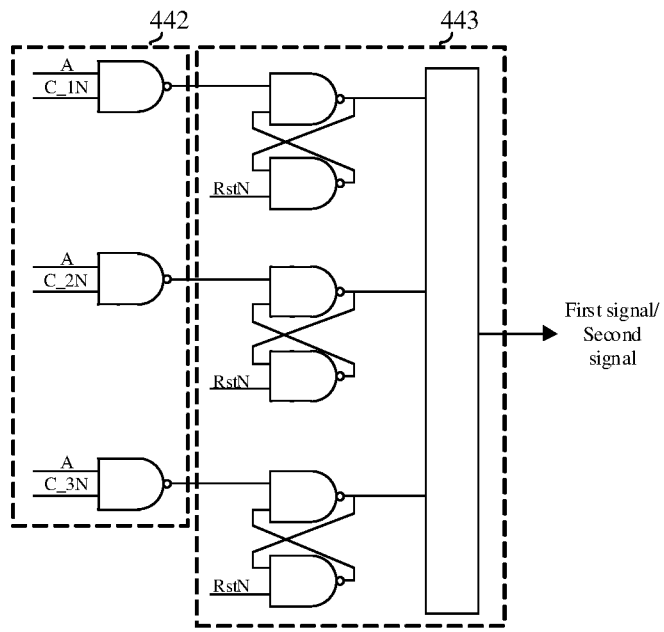
FIG. 5e shows an exemplary circuit structure of a comparison unit.

With reference to the timing diagram of FIG. 5c and an example of a circuit structure of the comparison unit shown in FIG. 5e, an example description of the operating process of the comparison unit and the output unit is provided. As shown in FIG. 5e, the comparison unit 442 includes three comparison subunits, which are three NAND gates in the figure. Inputs of the NAND gates are respectively connected to the A signal and inverted signals of the three normalized signals. The comparison result of the comparison subunits is sent to the output unit 443. The output unit 443 outputs, based on the output result of the comparison subunits, a signal for controlling the power control module to switch to the power-saving mode or the non-power-saving mode, such as the first signal or the second signal described above. It should be noted that N in the signal identification in the figure represents an inverted signal.

In this embodiment, the sampling unit of the state determining module generates a pulse based on the sampling of the system clock, the delay circuit generates the normalized signal based on the pulse, and the output unit outputs, based on the result of the comparison between the normalized signal and the system clock by the comparison unit, a signal for controlling the power control module to switch to the power-saving mode or the non-power-saving mode. In this way, based on the currently switched mode, the power control module selects to send a clock enable signal to power management modules for some or all memory banks, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only a local power supply for a selected memory bank needs to be woken up; and in the non-power-saving mode, local power supplies for all memory banks are woken up, thereby improving flexibility of power wakeup management and reducing power consumption.

In this embodiment, the state determining module controls the power control module to switch to the power-saving mode or the non-power-saving mode based on the system clock and the normalized signal. In this way, based on the currently switched mode, the power control module selects to send a clock enable signal to power management modules for some or all memory banks, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only a local power supply for a selected memory bank needs to be woken up; and in the non-power-saving mode, local power supplies for all memory banks are woken up, thereby improving flexibility of power wakeup management and reducing power consumption.

Figure 6A:
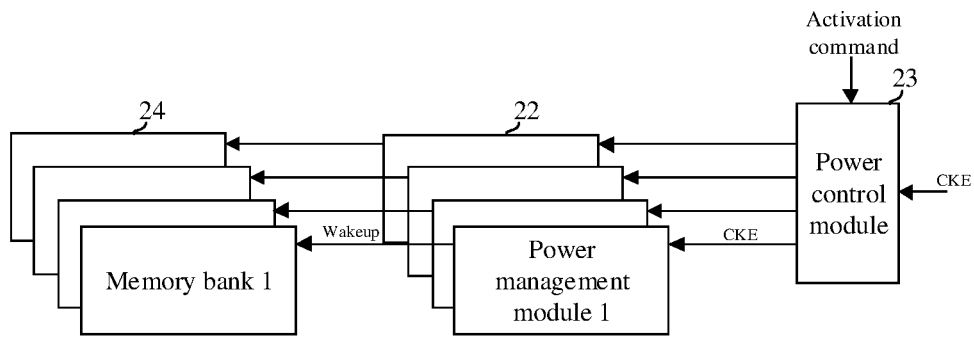
FIG. 6a and FIG. 6b show exemplary implementations of a power control module.
Figure 6B:
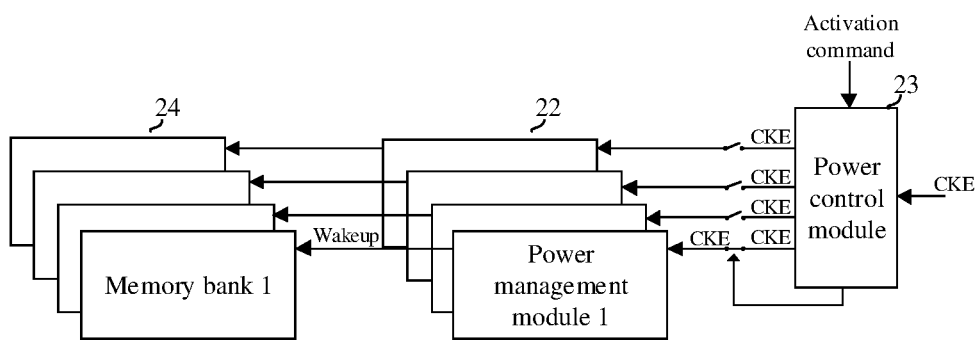

As an example, FIG. 6a and FIG. 6b show exemplary optional implementations of the power control module. It should be noted that in the figures, a connection between the power control module and the power management module are mainly taken as an example for description. For modules and structures (such as the control module) not shown in the figures, refer to the previous content.

When the power control module is in the power-saving mode, a local power supply for a selected memory bank may be woken up. In an example, the power control module may select to send a clock enable signal to a power management module corresponding to the selected memory bank, to better adapt to the general memory architecture without making excessive changes.

With reference to the scenario example, in the power-saving mode, the power control module 23 selects the memory bank 24 corresponding to the activation command for power wakeup, and for other memory banks 24 that are not selected by the activation command, their local power supplies do not need to be woken up, which effectively reduces power consumption of the memory while ensuring proper operation of the memory.

In an example, in the power-saving mode, the power control module 23 selects to send the clock enable signal to the power management module 22 for the memory bank 24 corresponding to the activation command by controlling a port that outputs the clock enable signal. It should be noted that the structures not shown in the figures are similar to those in the foregoing embodiment, and details are not further described.

Referring to FIG. 6a, for example, the power control module 23 has a plurality of output ports, including output ports in a one-to-one correspondence with the power management modules 22 for the memory banks 24. Assuming that it is determined according to the activation command that a memory bank 1 is selected this time, in the power-saving mode, the power control module 23 wakes up only a local power supply for the memory bank 1. Correspondingly, the power control module 23 transmits a clock enable signal to a power management module 1 for the memory bank 1 through an output port 1 corresponding to the power management module 1 for the memory bank 1, and output ports corresponding to the other power management modules do not output signals. Therefore, the power management module 1 wakes up the local power supply for the memory bank 1 in response to the received clock enable signal.

In another example, a controllable switch is provided between the power control module 23 and each of the power management modules 22; and in the power-saving mode, the power control module 23 selects to send the clock enable signal to the power management module for the memory bank 24 corresponding to the activation command by controlling controllable switches corresponding to different power management modules 22 to be on or off.

For example, referring to FIG. 6b, a controllable switch is provided on a path between the power control module 23 and the power management module 22 for each memory bank 24. States of these controllable switches are controlled by the power control module 23. Assuming that it is determined according to the activation command that a memory bank 1 is selected this time, in the power-saving mode, the power control module 23 wakes up only a local power supply for the memory bank 1. Correspondingly, the output ports of the power control module 23 all output the clock enable signal, but the power control module 23 selects to control a controllable switch corresponding to the power management module 1 for the memory bank 1 to be on, and controllable switches corresponding to the other power management modules to be all off, to select to transmit the clock enable signal to the power management module 1 for the memory bank 1. Therefore, the power management module 1 wakes up the local power supply for the memory bank 1 in response to the received clock enable signal.

In this embodiment, in the power-saving mode, the power control module selects to send the clock enable signal to the power management module for the selected memory bank, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only the local power supply for the selected memory bank needs to be woken up, thereby improving flexibility of power wakeup management and reducing power consumption.

Figure 7:
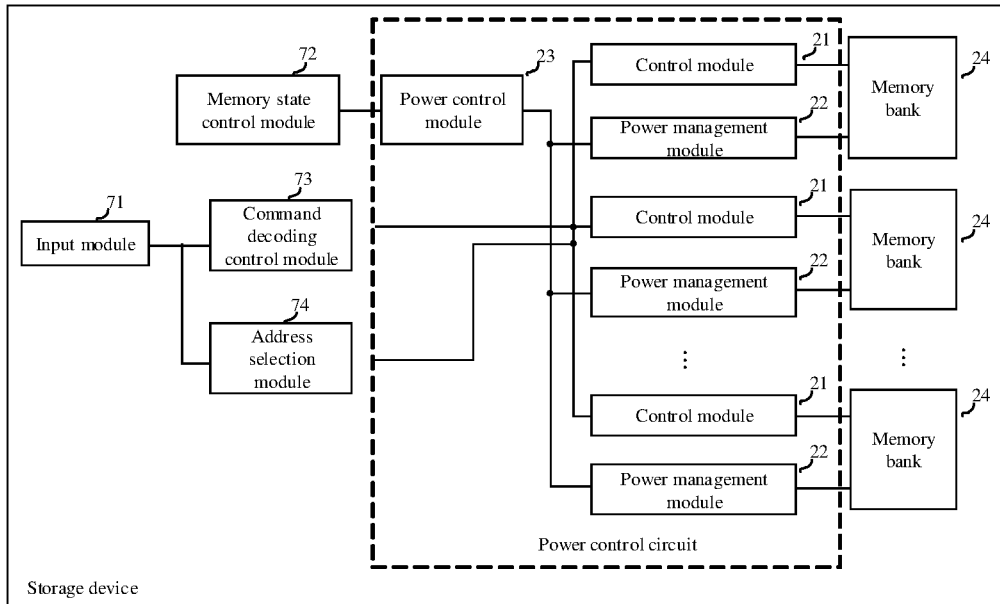
FIG. 7 is a schematic structural diagram of a storage device according to an embodiment of the present invention.

FIG. 7 is a schematic structural diagram of a storage device according to an embodiment of the present invention. As shown in FIG. 7, the storage device includes: an input module 71, a memory state control module 72, a command decoding control module 73, an address selection module 74, and the power control circuit described above.

The input module 71 receives various commands, including but not limited to, an activation command, an address, a control input signal, and the like. The memory state control module 72 outputs a clock enable signal CKE based on a state of a memory. In practice, an internal clock signal and a device input buffer and an output driver activate CKE HIGH and disable CKE Low. Setting CKE to low can provide precharge power down and self-refresh operations (all memory banks are idle), or effective power-down (there are memory banks in an active state). CKE is maintained at a high level throughout a read/write access.

The command decoding control module 73 parses the command transmitted by the input module 71, and sends an activation command to a control module 21 for a selected memory bank 24. The address selection module 74 may determine an address of a selected memory cell based on the command and signal transmitted by the input module 71 to activate a row and a column of the memory cell. It should be noted that the figure is merely an example, and for the structure and working principle of each circuit in this embodiment, refer to the related content in the foregoing embodiment.

Taking the scenario of the power-saving mode as an example, when the memory is activated to operate, the command decoding control module 73 transmits the activation command to the power control module 23, and the memory state control module 72 transmits the clock enable signal to the power control module 23. The power control module 23 in the power-saving mode determines the selected memory bank 24 according to the activation command, transmits the clock enable signal to the power management module 22 for the memory bank 24, and does not wake up local power supplies for the other memory banks 24. Taking the scenario of the non-power-saving mode as an example, when the memory is activated to operate, the command decoding control module 73 transmits the activation command to the power control module 23, and the memory state control module 72 transmits the clock enable signal to the power control module 23. The power control module 23 in the non-power-saving mode directly transmits the clock enable signal to the power management modules 22 for all the memory banks 24, to wake up the local power supplies for all the memory banks. In an example, the power-saving mode/non-power-saving mode may be determined by the foregoing state determining module.

In this embodiment, the power control module of the storage device may switch to the power-saving mode or the non-power-saving mode based on a state of the system clock, and select to send a clock enable signal to power management modules for some or all memory banks, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only a local power supply for a selected memory bank needs to be woken up; and in the non-power-saving mode, local power supplies for all memory banks are woken up, thereby improving flexibility of power wakeup management and reducing power consumption.

Figure 8:
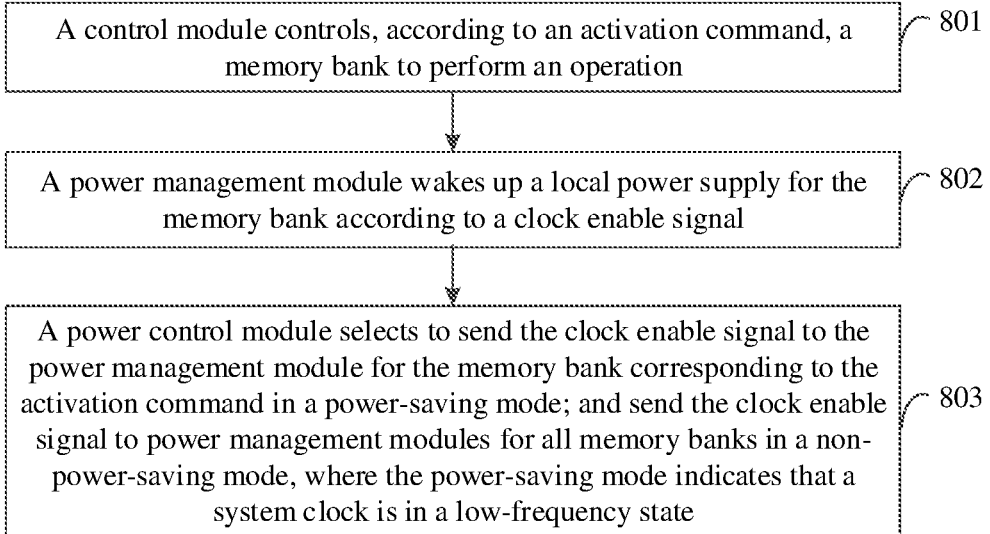
FIG. 8 is a schematic flowchart of a power control method according to an embodiment of the present invention.

FIG. 8 is a schematic flowchart of a power control method according to an embodiment of the present invention. The power control method is applicable to the structure as described in any one of the foregoing examples. The method includes the following steps:

Step 801: A control module controls, according to an activation command, a memory bank to perform an operation.

Step 802: A power management module wakes up a local power supply for the memory bank according to a clock enable signal.

Step 803: A power control module selects to send the clock enable signal to the power management module for the memory bank corresponding to the activation command in a power-saving mode; and send the clock enable signal to power management modules for all memory banks in a non-power-saving mode, where the power-saving mode indicates that a system clock is in a low-frequency state.

In an example, the power control module is in the power-saving mode or the non-power-saving mode in response to a control signal. Optionally, in the low-frequency state, a clock cycle of the system clock is not shorter than a time length required for a power wakeup response.

Figure 9:
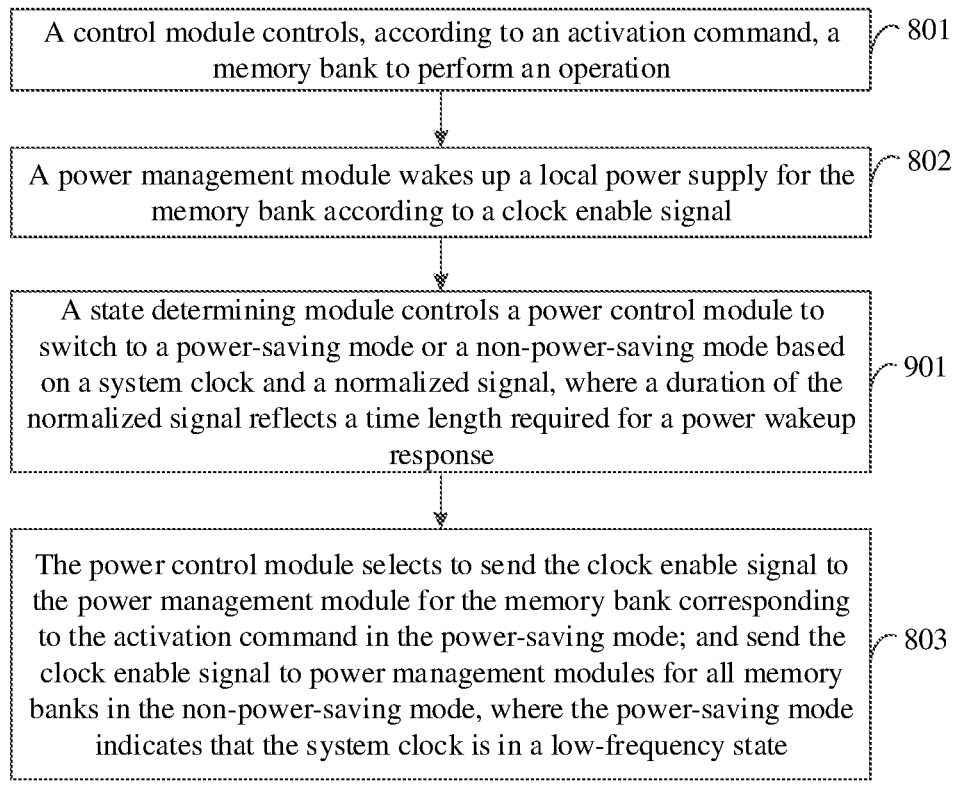
FIG. 9 is a schematic flowchart of another power control method according to an embodiment of the present invention.

Optionally, as shown in FIG. 9, to control the mode switching of the power control module, the method further includes the following step:

Step 901: The state determining module controls the power control module to switch to the power-saving mode or the non-power-saving mode based on the system clock and a normalized signal, where the normalized signal reflects the time length required for the power wakeup response.

Still optionally, step 901 of controlling, by the state determining module, the power control module to switch to the power-saving mode or the non-power-saving mode includes: sending, by the state determining module, a first signal to the power control module to instruct the power control module to switch to the power-saving mode; or sending a second signal to the power control module to instruct the power control module to switch to the non-power-saving mode.

With reference to the scenario example, when the state determining module determines, based on the system clock and the normalized signal, that the frequency of the system clock satisfies the normalized signal, the power control module is controlled to switch to the power-saving mode. In the power-saving mode, the power control module selects only the memory bank corresponding to the activation command for power wakeup, and for other memory banks that are not selected by the activation command, their local power supplies do not need to be woken up, which effectively reduces power consumption of the memory while ensuring proper operation of the memory. When the state determining module determines, based on the system clock and the normalized signal, that the frequency of the system clock does not satisfy the normalized signal, the power control module is controlled to switch to the non-power-saving mode. In the non-power-saving mode, the power control module directly transmits the clock enable signal to the power management modules for all the memory banks, which consumes a short time, and can adapt to a high-frequency system clock, thereby ensuring the proper operation of the memory.

In one manner, the power control module determines, based on a port through which the signal is currently received, a mode to which the power control module currently needs to switch. In another manner, the power control module determines, based on a currently received signal level, a mode to which the power control module currently needs to switch.

In an example, step 901 includes: generating the normalized signal based on the system clock; comparing the clock cycle of the system clock with the normalized signal; and outputting the first signal or the second signal based on a comparison result. The normalized signal reflects the time length required for the power wakeup response.

In practical application, the normalized signal may be generated in advance. In an example, a time length of the normalized signal may be set based on an actual time length of the power wakeup response that is simulated and tested under actual conditions. Fault tolerance may also be considered when the normalized signal is set. For example, a fault tolerance time length is added to a response time length in an actual test, to further ensure reliability of power management control.

In an example, the generating the normalized signal based on the system clock includes: generating a pulse signal based on a flipping edge of the system clock; and delaying the pulse signal and outputting the normalized signal. Optionally, there may be a plurality of normalized signals, to improve the accuracy of mode determining.

With reference to the scenario example, in the power-saving mode, the power control module selects the memory bank corresponding to the activation command for power wakeup, and for other memory banks that are not selected by the activation command, their local power supplies do not need to be woken up, which effectively reduces power consumption of the memory while ensuring proper operation of the memory.

In an example, in the power-saving mode, the power control module selects to send the clock enable signal to the power management module for the memory bank corresponding to the activation command by controlling a port that outputs the clock enable signal.

In another example, in the power-saving mode, the power control module selects to send the clock enable signal to the power management module for the memory bank corresponding to the activation command by selecting to control controllable switches between different power management modules and the power control module to be on or off.

In this embodiment, the power control module switches to the power-saving mode or the non-power-saving mode based on a state of the system clock, and may select to send a clock enable signal to power management modules for some or all memory banks, so that a corresponding power management module wakes up the local power supply for the memory bank in response to the clock enable signal, and the control module controls, in response to the activation command, the memory to perform an operation, to implement a function of the memory. Based on the power control circuit, a power management mode can be switched. In the power-saving mode, only a local power supply for a selected memory bank needs to be woken up; and in the non-power-saving mode, local power supplies for all memory banks are woken up, thereby improving flexibility of power wakeup management and reducing power consumption.

Persons skilled in the art may easily figure out other implementation solutions of the present invention after considering the specification and practicing the invention disclosed herein. The present invention is intended to cover any variations, purposes, or adaptive changes of the present invention. Such variations, purposes, or applicable changes follow the general principle of the present invention and include common knowledge or conventional technical means in the art which is not disclosed in the present invention. The specification and embodiments are merely considered as examples, and the true scope and spirit of the present invention are defined by the appended claims.

It should be understood that the present invention is not limited to the exact structure that has been described above and shown in the accompanying drawings, and various modifications and changes may be made without departing from the scope of the present invention. The scope of the present invention is defined only by the appended claims.

What is claimed is:

1. A power control circuit, comprising:
   a control module circuit configured to control, according to an activation command, a memory bank of a plurality of memory banks to perform an operation;
   a plurality of power management module circuits configured to wake up a local power supply for the memory bank according to a clock enable signal;

a power control module circuit communicatively coupled with the plurality of power management module circuits and configured to:
  send the clock enable signal to a power management module circuit of the plurality of power management circuits corresponding to the memory bank corresponding to the activation command in a power-saving mode, and
  send the clock enable signal to the plurality of power management module circuits corresponding to the plurality of memory banks in a non-power-saving mode, wherein the power-saving mode indicates that a system clock is in a low-frequency state, wherein in the low-frequency state, a clock cycle of the system clock is not shorter than a duration of a normalized signal indicating a time length required for waking up the memory bank corresponding to the activation command; and
a state determining module circuit communicatively coupled with the power control module circuit and configured to control the power control module circuit to switch to the power-saving mode or the non-power-saving mode based on the system clock and the normalized signal by:
  sending a first signal to the power control module circuit to instruct the power control module circuit to switch to the power-saving mode; and
  sending a second signal to the power control module circuit to instruct the power control module circuit to switch to the non-power-saving mode,
  wherein the state determining module circuit comprises a signal generation unit circuit, a comparison unit circuit, and an output unit circuit, the signal generation unit circuit is configured to generate the normalized signal based on the system clock; the comparison unit circuit is communicatively coupled with the signal generation unit circuit and is configured to compare the clock cycle of the system clock with the duration of the normalized signal; and the output unit circuit is communicatively coupled with the comparison unit circuit and the power control module circuit and is configured to output the first signal or the second signal based on an output result of the comparison unit circuit.

2. The power control circuit of claim 1, wherein:
the signal generation unit circuit comprises a sampling circuit and a delay circuit;
the sampling circuit is configured to generate a pulse signal based on a flipping edge of the system clock; and
the delay circuit is communicatively coupled with the sampling circuit and is configured to delay the pulse signal and output the normalized signal.

3. The power control circuit of claim 2, wherein the delay circuit comprises a plurality of stages of delay circuits, and the stages of delay circuits output a plurality of normalized signals including the normalized signal.

4. The power control circuit of claim 3, wherein the comparison unit circuit comprises a plurality of comparison subunit circuits, respectively communicatively coupled with the stages of delay circuits and configured to compare the clock cycle of the system clock with the durations of the normalized signals output by the stages of delay circuits; and
the output unit circuit is configured to output the first signal or the second signal based on an output result of the comparison subunit circuits.

5. The power control circuit of claim 4, wherein:
comparing the clock cycle of the system clock with the durations of the normalized signals comprises comparing a pulse width of the system clock with pulse widths of the normalized signals,
the state determining module circuit is configured to send the first signal to the power control module circuit in response to the pulse widths of the normalized signals being narrower than the pulse width of the system clock, and
the state determining module circuit is configured to send the second signal to the power control module circuit in response to the pulse widths of the normalized signals being wider than the pulse width of the system clock.

6. The power control circuit of claim 1, wherein the activation command is output to a control module circuit of a memory bank at a corresponding address after the address is decoded by a command decoding control module circuit.

7. The power control circuit of claim 1, wherein in the power-saving mode, the power control module circuit is configured to send the clock enable signal to the power management module circuit corresponding to the memory bank corresponding to the activation command by controlling a port that outputs the clock enable signal.

8. The power control circuit of claim 1, further comprising a plurality of controllable switches, each of the plurality of controllable switches being between the power control module circuit and each of the plurality of power management module circuits corresponding to the plurality of memory banks,
  wherein in the power-saving mode, the power control module circuit is configured to send the clock enable signal to the power management module circuit corresponding to the memory bank corresponding to the activation command by controlling at least some of the plurality of controllable switches to be on or off.

9. A power control method, applicable to a power control circuit comprising a control module circuit, a plurality of power management module circuits, a power control module circuit, and a state determining module circuit, comprising:
  controlling, by the control module circuit according to an activation command, a memory bank of a plurality of memory banks to perform an operation;
  waking up, by the plurality of power management module circuits, a local power supply for the memory bank according to a clock enable signal;
  sending, by the power control module circuit, the clock enable signal to a power management module circuit of the plurality of power management circuits corresponding to the memory bank corresponding to the activation command in response to a power-saving mode;
  sending, by the power control module circuit, the clock enable signal to the plurality of power management module circuits corresponding to the plurality of memory banks in response to a non-power-saving mode, wherein the power-saving mode indicates that a system clock is in a low-frequency state, wherein in the low-frequency state, a clock cycle of the system clock is not shorter than a duration of a normalized signal indicating a time length required for waking up the memory bank corresponding to the activation command; and
  controlling, by the state determining module circuit, the power control module circuit to switch to the power-saving mode or the non-power-saving mode based on the system clock and the normalized signal by:

sending, by the state determining module circuit, a first signal to the power control module circuit to instruct the power control module circuit to switch to the power-saving mode; or sending, by the state determining module circuit, a second signal to the power control module circuit to instruct the power control module circuit to switch to the non-power-saving mode, wherein the state determining module circuit comprises a signal generation unit circuit, a comparison unit circuit, and an output unit circuit, and the method further comprises:

generating, by the signal generation unit circuit, the normalized signal based on the system clock;

comparing, by the comparison unit circuit, the clock cycle of the system clock with the normalized signal; and outputting, by the output unit circuit, the first signal or the second signal based on an output result of the comparison unit circuit.

10. The method of claim 9, wherein:

the signal generation unit circuit comprises a sampling circuit and a delay circuit;

the sampling circuit is configured to generate a pulse signal based on a flipping edge of the system clock; and the delay circuit is communicatively coupled with the sampling circuit and is configured to delay the pulse signal and output the normalized signal.

11. The method of claim 10, wherein the delay circuit comprises a plurality of stages of delay circuits configured to output a plurality of normalized signals including the normalized signal, and the comparison unit circuit comprises a plurality of comparison subunit circuits, and the method further comprises:

comparing, by the comparison subunit circuits, the clock cycle of the system clock with the durations of the normalized signals output by the stages of delay circuits; and outputting, by the output unit circuit, the first signal or the second signal based on an output result of the comparison subunit circuits.

12. The method of claim 11, wherein comparing the clock cycle of the system clock with the durations of the normalized signals comprises comparing a pulse width of the system clock with pulse widths of the normalized signals, and the method further comprises:

sending, by the state determining module circuit, the first signal to the power control module circuit in response to the pulse widths of the normalized signals being narrower than the pulse width of the system clock; and sending, by the state determining module circuit, the second signal to the power control module circuit in response to the pulse widths of the normalized signals being wider than the pulse width of the system clock.

* * * * *